US009521770B2

(12) United States Patent
Li

(10) Patent No.: US 9,521,770 B2
(45) Date of Patent: Dec. 13, 2016

(54) CURVATURE-ADJUSTABLE CURVED DISPLAY DEVICE

(71) Applicant: Shenzhen China Star Optoelectronics Technology Co., Ltd., Shenzhen, Guangdong (CN)

(72) Inventor: Quan Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 316 days.

(21) Appl. No.: 14/386,790

(22) PCT Filed: Aug. 26, 2014

(86) PCT No.: PCT/CN2014/085216
§ 371 (c)(1),
(2) Date: Sep. 19, 2014

(87) PCT Pub. No.: WO2016/026158
PCT Pub. Date: Feb. 25, 2016

(65) Prior Publication Data
US 2016/0249471 A1   Aug. 25, 2016

(30) Foreign Application Priority Data

Aug. 19, 2014 (CN) .......................... 2014 1 0413317

(51) Int. Cl.
| H05K 7/00 | (2006.01) |
| H05K 5/00 | (2006.01) |
| H05K 5/02 | (2006.01) |
| G09F 9/30 | (2006.01) |

(52) U.S. Cl.
CPC ............... *H05K 5/0234* (2013.01); *G09F 9/30* (2013.01); *H05K 5/02* (2013.01)

(58) Field of Classification Search
CPC ...... H05K 5/2602; G09G 3/3225; G09F 9/301
See application file for complete search history.

(56) References Cited

U.S. PATENT DOCUMENTS

| 2013/0155655 A1* | 6/2013 | Lee | H05K 5/03 362/97.1 |
| 2013/0207946 A1* | 8/2013 | Kim | G09G 3/3225 345/204 |
| 2014/0118910 A1* | 5/2014 | Sung | G09F 9/301 361/679.01 |

FOREIGN PATENT DOCUMENTS

CN    103559835 A    2/2014

* cited by examiner

*Primary Examiner* — Jerry Wu
(74) *Attorney, Agent, or Firm* — Andrew C. Cheng

(57) ABSTRACT

The present invention relates to a curvature-adjustable curved display device including: a base, a curved display device and an adjusting assembly. The curved display device is disposed on the base. The adjusting assembly is disposed between the curved display device and the base to connect the curved display device with the base. The adjusting assembly is slidable with respect to the base to thereby adjust the curvature of the curved display device. Accordingly, by disposing the adjusting assembly between the curved display device and the base, the curvature of the curved display device can be adjusted in a preset range of curvature by sliding the adjusting assembly with respect to the base.

12 Claims, 4 Drawing Sheets

CURVATURE-ADJUSTABLE CURVED DISPLAY DEVICE

TECHNICAL FIELD

The present invention relates to the field of display technology, and particularly to a curvature-adjustable curved display device.

DESCRIPTION OF RELATED ART

With the evolution of optoelectronic and semiconductor technologies, flat panel display devices also are rapidly developed. In recent years, major manufacturers rolled out curved display devices. Overall, the curved display devices can provide better viewing experience from a border to another border, while the traditional flat display device has an unsatisfactory display effect at the border of the screen. The surround type arc design of whole screen toward the user of the curved display device can provide wide panoramic image effect, the center and the periphery of the screen both are able to bring same visual enjoyment to the user, and further can reduce the off axis viewing distortion when viewing at a close distance. In addition, the curved display device could elongate the viewing distance of the user and thereby achieving better viewing experience.

Accordingly, compared with the traditional flat display device, the curved display device has the advantages of: brand differentiation, wider viewing angle and reducing the distortion when viewing at a close distance. However, most of the conventional curved display device are curvature-constant curved display devices and are set with predetermined curvatures at the factory, and therefore their curvatures cannot be adjusted by the user.

SUMMARY

In order to solve the problems existed in the prior art, an objective of the present invention is to provide a curvature-adjustable curved display device. The curvature-adjustable curved display device includes a base, a curved display device and an adjusting assembly. The curved display device is disposed on the base. The adjusting assembly is disposed between the curved display device and the base to connect the curved display device with the base. The adjusting assembly is slidable with respect to the base to thereby adjust a curvature of the curved display device.

In an exemplary embodiment, the curved display device includes a first border portion and a second border portion. The base includes a first supporting body. The first border portion is disposed on a first can portion of the first supporting body, and the second border portion is disposed on a second can portion of the first supporting body. The adjusting assembly is attached to side surfaces of the first border portion and second border portion. The adjusting assembly is slidably disposed in the first end portion and second end portion.

In an exemplary embodiment, the adjusting assembly includes a first adjusting column and a second adjusting column. The first adjusting column and the second adjusting column each include a column body and a sliding block disposed at the bottom of the column body. The first end portion and the second end portion each are formed with a guiding rail. The column body of the first adjusting column is attached to the side surface of the first border portion and the sliding block of the first adjusting column is disposed in the guiding rail of the first end portion. The column body of the second adjusting column is attached to the side surface of the second border portion and the sliding block of the second adjusting column is disposed in the guiding rail of the second end portion.

In an exemplary embodiment, the base further includes a second supporting body laterally extending from a middle portion of the first supporting body. The curved display device further includes a middle portion between the first border portion and the second border portion. The middle portion of the curved display device is fixedly disposed on the second supporting body.

In an exemplary embodiment, the second supporting body is formed with a projection. A bottom surface of the middle portion of the curved display device is formed with a receiving slot. The projection is correspondingly disposed in the receiving slot.

In an exemplary embodiment, a securing portion is formed outwardly extending from a connection portion of the column body and the sliding block. When the sliding block of the first adjusting column is positioned in the guiding rail of the first end portion and the sliding block of the second adjusting column is positioned in the guiding rail of the second end portion, the securing portion of the first adjusting column is fixed with the first end portion, the securing portion of the second adjusting column is fixed with the second end portion.

In an exemplary embodiment, the curved display device further includes a first fixing column and a second fixing column. The securing portion of the first adjusting column is formed with a first through hole, the securing portion of the second adjusting column is formed with a second through hole, an upper surface of the first end portion is formed with a plurality of first recesses, an upper surface of the second end portion is formed with a plurality of second recesses. The first fixing column penetrates through the first through hole and then is disposed in one of the plurality of first recesses. The second fixing column penetrates through the second through hole and then is disposed in one of the plurality of second recesses.

In an exemplary embodiment, the plurality of first recesses are arranged with equal intervals, the plurality of second recesses are arranged with equal intervals, the plurality of first recesses and the plurality of second recesses are symmetrically disposed in one-to-one manner.

In an exemplary embodiment, the sliding block of the first adjusting column is formed with a first through hole, the sliding block of the second adjusting column is formed with a second through hole, a first sidewall of the guiding rail of the first end portion is formed with a plurality of third through holes, a second sidewall of the guiding rail of the first end portion is formed with a plurality of third recesses, a first sidewall of the guiding rail of the second end portion is formed with a plurality of fourth through holes, and a second side wall of the guiding rail of the second end portion is formed with a plurality of fourth recesses. The curved display device further includes a third fixing column and a fourth fixing column. When the sliding block of the first adjusting column is positioned in the guiding rail of the first end portion and the sliding block of the second adjusting column is positioned in the guiding rail of the second end portion, the third fixing column sequentially penetrates through one of the plurality of third through holes, the first through hole and then is disposed in one of the plurality of third recesses, the fourth fixing column sequentially penetrates through one of the plurality of fourth through holes, the second through hole and then is disposed in one of the plurality of fourth recesses.

In an exemplary embodiment, the plurality of third through holes are arranged with equal intervals, the plurality of fourth through holes are arranged with equal intervals, the plurality of third through holes and the plurality of fourth through holes are symmetrically disposed in one-to-one manner.

Sum up, according to the various embodiments of the present invention, the two side surfaces of the curved display device respectively are disposed with the adjusting columns, by sliding the adjusting columns with respect to the base, the curvature of the curved display device can be adjusted in a preset range of curvature.

BRIEF DESCRIPTION OF THE DRAWINGS

The above and other aspects, features and advantages of embodiments of the present invention will be more apparent from the following detailed description taken in conjunction with the accompanying drawings, in which.

DETAILED DESCRIPTION OF EMBODIMENTS

Figure 1:
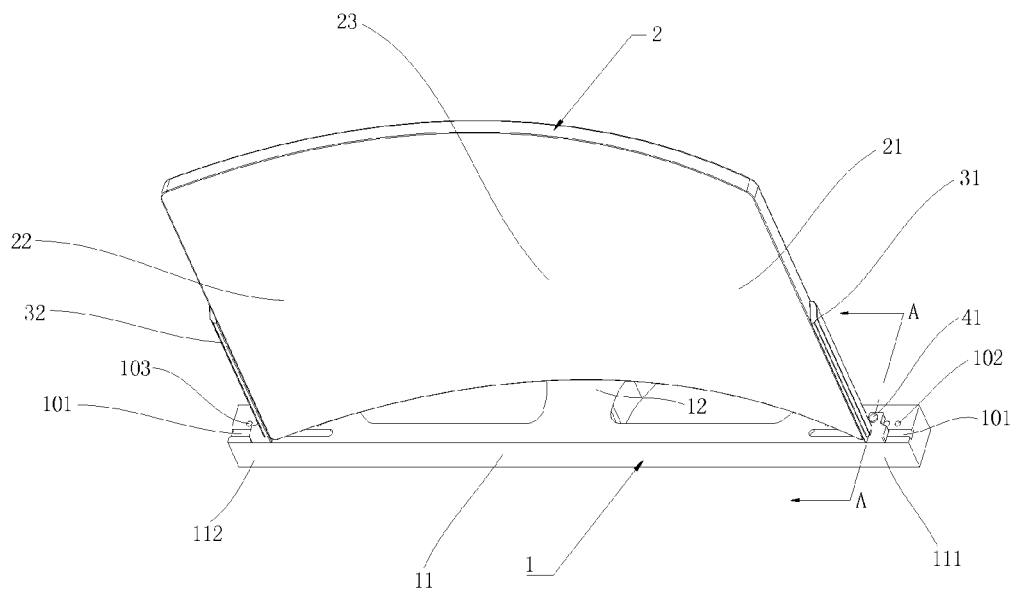
FIG. 1 is a schematic perspective view of a curvature-adjustable curved display device according to a first embodiment of the present invention.

In the following, various embodiments of the present invention will be described in detail with reference to accompanying drawings. The present invention may be embodied in many different forms and should not be construed as limiting to the embodiments set forth herein. Rather, these embodiments are provided to explain the principles of the present invention and its practical applications, so that other skilled in the art can understand various embodiments of the present invention and various modifications suitable for specific intended applications.

In the drawings, the same reference numerals will be used throughout the drawings to refer to the same or like components. It is understood that, although the terminologies such as "first", "second", "third", "fourth" can be used herein to describe various components, these components should not be limited by the terminologies. These terminologies are only used to distinguish one component from another component.

Figure 2:
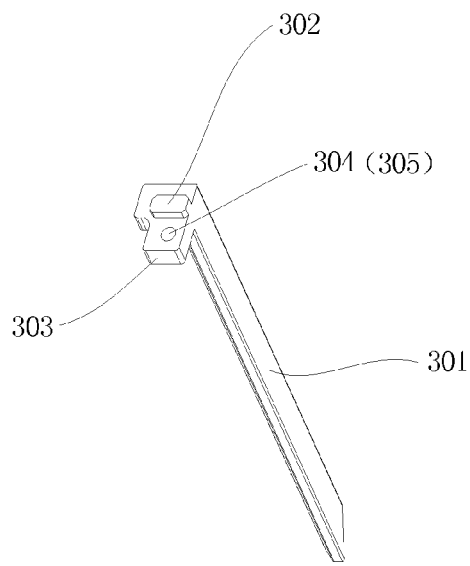
FIG. 2 is a schematic perspective view of an adjusting column according to the first embodiment of the present invention.
Figure 3:
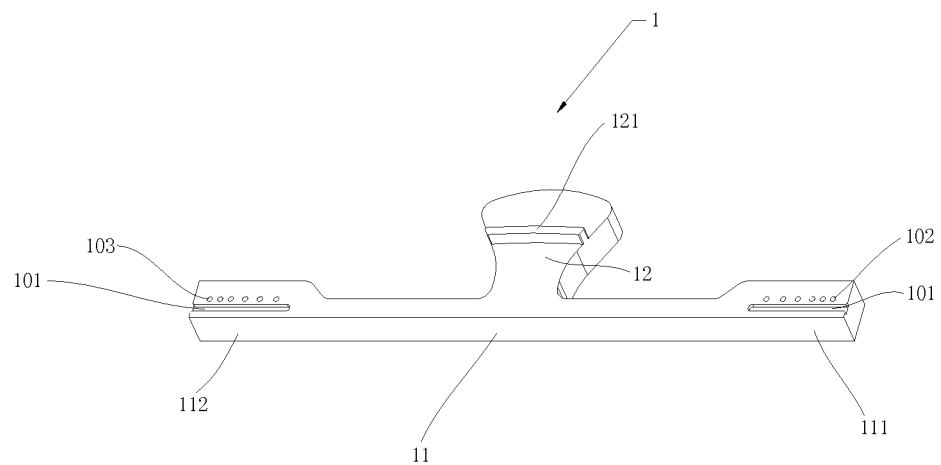
FIG. 3 is a schematic perspective view of a base according to the first embodiment of the present invention.
Figure 4:
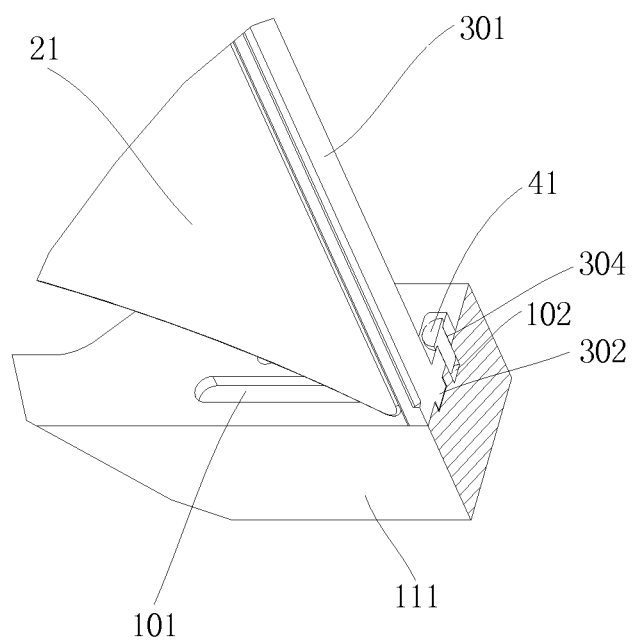
FIG. 4 is a schematic partial view of the curvature-adjustable curved display device in FIG. 1 taken along the line A-A.

FIG. 1 is a schematic perspective view of a curvature-adjustable curved display device according to a first embodiment of the present invention. FIG. 2 is a schematic perspective view of an adjusting column according to the first embodiment of the present invention. FIG. 3 is a schematic perspective view of a base according to the first embodiment of the present invention. FIG. 4 is a schematic partial view of the curvature-adjustable curved display device in FIG. 1 taken along the line A-A.

Referring to FIG. 1 through FIG. 4, the curvature-adjustable curved display device according to the first embodiment of the present invention includes a base 1, a curved display device 2 and an adjusting assembly. The curved display device 2 may be for example a curved liquid crystal display device or a curved organic light-emitting diode (OLED) display device. The curved display device 2 is disposed on the base 1. The adjusting assembly is disposed between the curved display device 2 and the base 1, so as to movably connect the curved display device 2 with the base 1. The adjusting assembly is slidable along a predetermined direction (e.g., horizontal direction) with respect to the base t, to thereby adjust the curvature of the curved display device 2. In this embodiment, the curved display device 2 can be arbitrarily adjusted in a certain range of curvature.

Specifically, the curved display device 2 includes a first border portion 21, a second border portion 22 and a middle portion 23 between the first border portion 21 and the second border portion 22. The first border portion 21 and the second border portion 22 are axial symmetrical. The base 1 includes a first supporting body 11. The first border portion 21 is disposed on a first end portion 111 of the first supporting body 11, and the second border portion 22 is disposed on a second end portion 112 of the first supporting body 11. The adjusting assembly is attached to side surfaces of the first and second border portions 21, 22 and slidably disposed in the first and second end portions 111, 112. Accordingly, the adjusting assembly can slide with respect to the first supporting body 11 by sliding in the first and second end portions 111, 112, cause the first and second border portions 21, 22 to move toward the middle of the first supporting body 11 or cause the first and second border portions 21, 22 to move away from the middle of the first supporting body 11, and thereby adjust the curvature of the curved display device 2.

In this embodiment, in order to achieve the above purpose, the adjusting assembly includes a first adjusting column 31 and a second adjusting column 32. The first and second adjusting columns 31, 32 each include a column body 301 and a sliding block 302 disposed at the bottom of the column body 301. The first and second end portions 111, 112 each are formed with a guiding rail 101. The guiding rail 101 of the first end portion 111 and the guiding rail 101 of the second end portion 112 are symmetrically disposed. The column body 301 of the first adjusting column 31 is attached to the side surface of the first border portion 21, and the sliding block 302 of the first adjusting column 31 is disposed in the guiding rail 101 of the first end portion 111. The column body 301 of the second adjusting column 32 is attached to the side surface of the second border portion 22, and the sliding block 302 of the second adjusting column 32 is disposed in the guiding rail 101 of the second end portion 112.

In order to improve the stability of the curved display device 2, in this embodiment, the base 1 further includes a second supporting body 12 laterally extending from the middle portion of the first supporting body 11. The middle portion 23 of the curved display device 2 can be fixedly disposed on the second supporting body 12. For example, the second supporting body 12 is formed with a projection 121, the bottom surface of the middle portion 23 of the curved display device 2 is correspondingly formed with a receiving slot (not shown), the projection 121 is disposed in the receiving slot in an assembled state, and thereby the middle portion 23 of the curved display device 2 is fixedly disposed on the second supporting body 12 to improve the stability of the curved display device 2.

In addition, in order to hold the curvature after completing the curvature adjustment of the curved display device 2, in this embodiment, a securing portion 303 is formed outwardly extending from a connection portion of the column body 301 and the sliding block 302 of each of the first and second adjusting columns 31, 32. When the sliding block 302 of the first adjusting column 31 is positioned (sliding is ended) in the guiding rail 101 of the first end portion 111 and the sliding block 302 of the second adjusting column 32 is positioned in the guiding rail 101 of the second end portion 112, the securing portion 303 of the first adjusting column 31 is fixed with the first end portion 111 and the securing portion 303 of the second adjusting column 32 is fixed with the second end portion 112, and thereby the curvature of the curved display device 2 after being adjusted is held.

Furthermore, in order to carry out the fixing of the securing portion 303 of the first adjusting column 31 with the first end portion 111 and the fixing of the securing portion 303 of the second adjusting column 32 with the second end portion 112, the curvature-adjustable curved display device according to this embodiment further includes a first fixing column 41 and a second fixing column (not shown). The securing portion 303 of the first adjusting column 31 is formed with a first through hole 304, the securing portion 303 of the second adjusting column 32 is formed with a second through hole 305, the first end portion 111 is formed with a plurality of first recesses 102 arranged in an upper surface thereof, the second end portion 112 is formed with a plurality of second recesses 103 arranged in an upper surface thereof. The first fixing column 41 penetrates through the first through hole 304 and then is disposed in one of the first recesses 102, and the second securing column penetrates through the second through hole 305 and then is disposed in one of the second recesses 103. In this embodiment, the first fixing column 41 and the second fixing column each may be for example a bolt or a pin, and so on.

In this embodiment, the first recesses 102 and the second recesses 103 are symmetrically disposed in one-to-one manner. The arrangement direction of the first recesses 102 is identical with the lengthwise direction of the guiding rail 101 of the first end portion 111, and correspondingly the arrangement direction of the second recesses 103 is identical with the lengthwise direction of the guiding rail 101 of the second end portion 112. Moreover, preferably, the first recesses 102 are arranged with equal intervals, and the second recesses 103 are arranged with equal intervals, but the present invention is not limited to this. For example, the first recesses 102 can be arranged with non-equal intervals according to practical requirement, and correspondingly the second recesses 103 are arranged with non-equal intervals according to the practical requirement.

Figure 5:
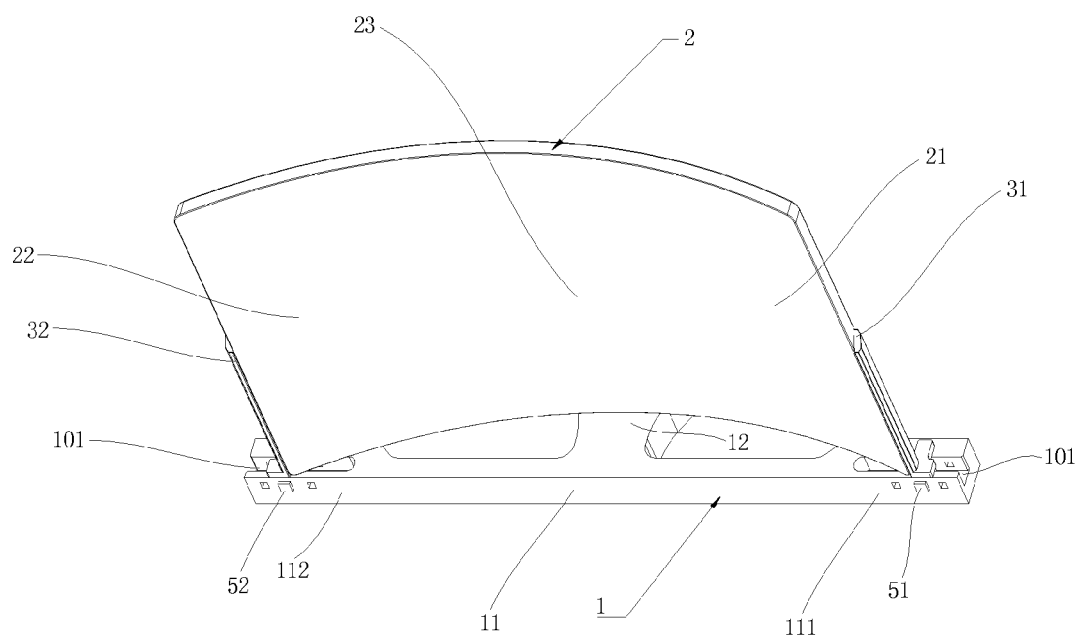
FIG. 5 is a schematic perspective view of a curvature-adjustable curved display device according to a second embodiment of the present invention.
Figure 6:
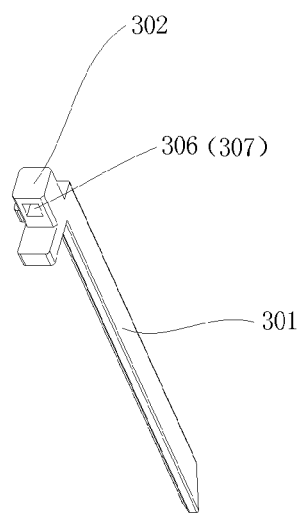
FIG. 6 is a schematic perspective view of an adjusting column according to the second embodiment of the present invention.
Figure 7:
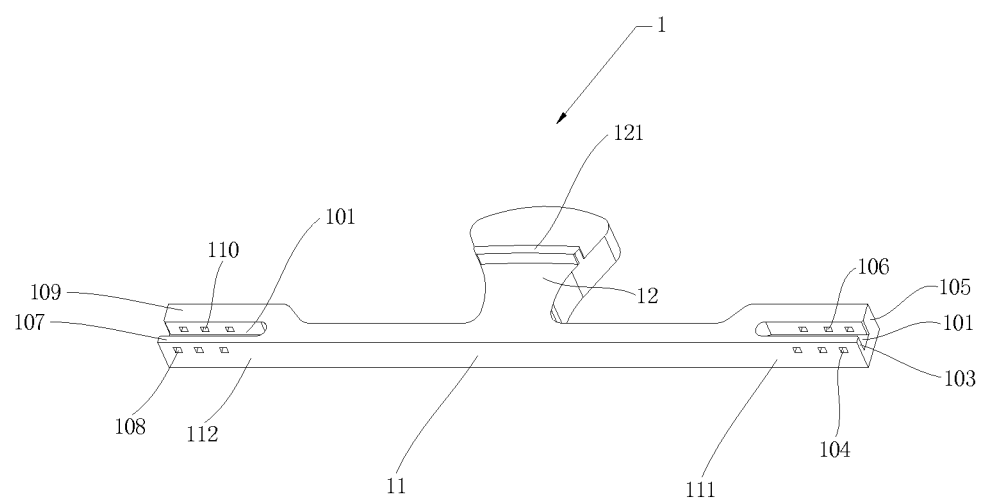
FIG. 7 is a schematic perspective view of a base according to the second embodiment of the present invention.
Figure 8:
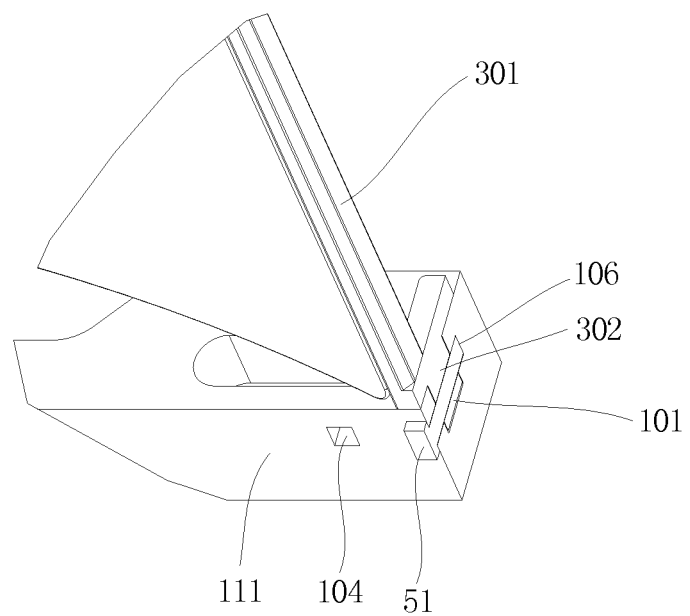
FIG. 8 is a schematic partial view of the curvature-adjustable curved display device in FIG. 5 taken along the line A-A.

FIG. 5 is a schematic perspective view of a curvature-adjustable curved display device according to a second embodiment of the present invention. FIG. 6 is a schematic perspective view of an adjusting column according to the second embodiment of the present invention. FIG. 7 is a schematic perspective view of a base according to the second embodiment of the present invention. FIG. 8 is a schematic partial view of the curvature-adjustable curved display device in FIG. 5 taken along the line A-A.

Referring to FIG. 5 through FIG. 8, the curvature-adjustable curved display device according to the second embodiment of the present invention includes a base 1, a curved display device 2 and an adjusting assembly. The curved display device 2 may be for example a curved liquid crystal display device or an organic light-emitting diode (OLED) display device. The curved display device 2 is disposed on the base 1. The adjusting assembly is disposed between the curved display device 2 and the base 1 to movably connect the curved display device 2 with the base 1. The adjusting assembly is slidable along a predetermined direction (e.g., horizontal direction) with respect to the base 1, to adjust the curvature of the curved display device 2. It can be understood that, in this embodiment, the curved display device 2 can be arbitrarily adjusted in a certain range of curvature.

Specifically, the curved display device 2 includes a first border portion 21, a second border portion 22 and a middle portion 23 between the first border portion 21 and the second border portion 22. The first border portion 21 and the second border portion 22 are axial symmetrical. The base 1 includes a first supporting body 11. The first border portion 21 is disposed on a first end portion 111 of the first supporting body 11, and the second border portion 22 is disposed on a second end portion 112 of the first supporting body 11. The adjusting assembly is attached to side surfaces of the first and second border portions 21, 22 and slidably disposed in the first and second end portions 111, 112. Accordingly, the adjusting assembly can slide with respect to the first supporting body 11 by sliding in the first and second end portions 111, 112, cause the first and second border portions 21, 22 to move toward a middle portion of the first supporting body 11 or cause the first and second border portions 21, 22 to move away from the middle portion of the second supporting body 11, and thereby adjust the curvature of the curved display device 2.

In this embodiment, in order to achieve the above purpose, the adjusting assembly includes a first adjusting column 31 and a second adjusting column 32. The first and second adjusting columns 31, 32 each include a column body 301 and a sliding block 302 disposed at the bottom of the column body 301. The first and second end portions 111, 112 each are formed with a guiding rail 101. The guiding rail 101 of the first end portion 111 and the guiding rail 101 of the second end portion 112 are symmetrically disposed. The column body 301 of the first adjusting column 31 is attached to the side surface of the first border portion 21, and the sliding block 302 of the first adjusting column 31 is disposed in the guiding rail 101 of the first end portion 111. The column body 301 of the second adjusting column 32 is attached to the side surface of the second border portion 22, and the sliding block 302 of the second adjusting column 32 is disposed in the guiding rail 101 of the second end portion 112.

In order to improve the stability of the curved display device 2, in this embodiment, the base 1 further includes a second supporting body 12 laterally extending from the middle portion of the first supporting body 11. The middle portion 23 of the curved display device 2 can be fixedly disposed on the second supporting body 12. For example, the second supporting body 12 is formed with a projection 121, the bottom surface of the middle portion 23 of the curved display device 2 correspondingly is formed with a receiving slot (not shown), the projection 121 is disposed in the receiving slot in an assembled state, and thereby the middle portion 23 of the curved display device 2 is fixedly disposed on the second supporting body 12 to improve the stability of the curved display device 2.

In addition, in order to hold the curvature after completing the curvature adjustment of the curved display device 2, in this embodiment, the sliding block 302 of the first adjusting column 31 is formed with a first through hole 306, the sliding block 302 of the second adjusting column 32 is formed with a second through hole 307, a first sidewall 103 of the guiding rail 101 of the first end portion 111 is formed with a plurality of third through holes 104, a second sidewall 105 of the guiding rail 101 of the first end portion 111 is formed with a plurality of third recesses 106, a first sidewall 107 of the guiding rail 101 of the second end portion 112 is formed with a plurality of fourth through holes 108, and a second sidewall 109 of the guiding rail 101 of the second end portion 112 is formed with a plurality of fourth recesses 110. Moreover, the curvature-adjustable curved display device according to the second embodiment of the present invention further includes a third fixing column 51 and a fourth fixing column 52. When the sliding block 302 of the first adjusting column 31 is positioned (i.e., sliding is ended) in the guiding rail 101 of the first end portion 111 and the sliding block 302 of the second adjusting column 32 is positioned in the guiding rail 101 of the second end portion 112, the third fixing column 51 sequentially penetrates through one of the third through holes 104, the first through hole 306 and then is disposed in one of the third recesses 106, the fourth fixing column 52 sequentially penetrates through one of the fourth through holes 108, the second through hole 307 and then is disposed in one of the fourth recesses 110, and thereby the curvature of the curved display device 2 after being adjusted is held. In this embodiment, the third fixing column 51 and the fourth fixing column 52 each may be for example a bolt or a pin, and so on.

In this embodiment, the third through holes 104 are corresponded with the third recesses 106 in one-to-one manner, and the fourth through holes 108 are corresponded with the fourth recesses 110 in one-to-one manner. The third through holes 104 and the fourth through holes 108 are symmetrically disposed in one-to-one manner. The arrangement direction of the third through holes 104 is identical with the lengthwise direction of the guiding rail 101 of the first end portion 111, and correspondingly the arrangement direction of the fourth through holes 108 is identical with the lengthwise direction of the guiding rail 101 of the second end portion 112. In addition, preferably, the third through holes 104 are arranged with equal intervals, and the fourth through holes 108 are arranged with equal intervals, but the present invention is not limited to this. For example, the third through holes 104 can be arranged with non-equal intervals according to practical requirement, and correspondingly the fourth through holes 108 are arranged with non-equal intervals according to the practical requirement.

In summary, according to the various embodiments of the present invention, two side surfaces of the curved display device are respectively disposed with the adjusting columns, by sliding the adjusting columns with respect to the base, the curvature of the curved display device can be adjusted in a preset range of curvature.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A curvature-adjustable curved display device comprising: a base comprising a plurality of recesses, a curved display device and an adjusting assembly; wherein the curved display device is disposed on the base, the adjusting assembly is disposed between the curved display device and the base to connect the curved display device with the base, the adjusting assembly is slidable with respect to the base to thereby adjust a curvature of the curved display device; and each end of the adjusting assembly comprises a through hole and a sliding block; wherein each of the sliding block is slidable in a guide rail on a corresponding side of the base to thereby adjust the curvature of the display by a fixing column penetrates through the corresponding through hole and a corresponding one of the recesses.

2. The curvature-adjustable curved display device as claimed in claim 1, wherein the curved display device comprises a first border portion and a second border portion, the base comprises a first supporting body, the first border portion is disposed on a first end portion of the first supporting body, the second border portion is disposed on a second end portion of the first supporting body, the adjusting assembly is attached to side surfaces of the first border portion and second border portion, and the adjusting assembly is slidably disposed in the first end portion and second end portion.

3. The curvature-adjustable curved display device as claimed in claim 2, wherein the adjusting assembly comprises a first adjusting column and a second adjusting column, the first adjusting column and the second adjusting column each comprise a column body and the sliding block disposed at the bottom of the column body, the first end portion and the second end portion each are formed with the guiding rail, the column body of the first adjusting column is attached to the side surface of the first border portion and the sliding block of the first adjusting column is disposed in the guiding rail of the first end portion, the column body of the second adjusting column is attached to the side surface of the second border portion and the sliding block of the second adjusting column is disposed in the guiding rail of the second end portion.

4. The curvature-adjustable curved display device as claimed in claim 2, wherein the base further comprise a second supporting body laterally extending from a middle portion of the first supporting body, the curved display device further comprises a middle portion between the first border portion and the second border portion, the middle portion of the curved display device is fixedly disposed on the second supporting body.

5. The curvature-adjustable curved display device as claimed in claim 3, wherein the base further comprises a second supporting body laterally extending from a middle portion of the first supporting body, the curved display device further comprises a middle portion between the first border portion and the second border portion, the middle portion of the curved display device is fixedly disposed on the second supporting body.

6. The curvature-adjustable curved display device as claimed in claim 4, wherein the second supporting body is formed with a projection, a bottom surface of the middle portion of the curved display device is formed with a receiving slot, and the projection is correspondingly disposed in the receiving slot.

7. The curvature-adjustable curved display device as claimed in claim 5, wherein the second supporting body is formed with a projection, a bottom surface of the middle portion of the curved display device is formed with a receiving slot, and the projection is correspondingly disposed in the receiving slot.

8. The curvature-adjustable curved display device as claimed in claim 3, wherein a securing portion is formed outwardly extending from a connection portion of the column body and the sliding block, when the sliding block of the first adjusting column is positioned in the guiding rail of the first end portion and the sliding block of the second adjusting column is positioned in the guiding rail of the second end portion, the securing portion of the first adjusting column is fixed with the first end portion, the securing portion of the second adjusting column is fixed with the second end portion.

9. The curvature-adjustable curved display device as claimed in claim 8, wherein curved display device further comprises a first fixing column and a second fixing column, the securing portion of the first adjusting column is formed with a first through hole, the securing portion of the second adjusting column is formed with a second through hole, an upper surface of the first end portion is formed with a plurality of first recesses, an upper surface of the second end portion is formed with a plurality of second recesses, the first fixing column penetrates through the first through hole and then is disposed in one of the plurality of first recesses, the second fixing column penetrates through the second through hole and then is disposed in one of the plurality of second recesses.

10. The curvature-adjustable curved display device as claimed in claim 9, wherein the plurality of first recesses are arranged with equal intervals, the plurality of second recesses are arranged with equal intervals, the plurality of first recesses and the plurality of second recesses are symmetrically disposed in one-to-one manner.

11. The curvature-adjustable curved display device as claimed in claim 3, wherein the sliding block of the first adjusting column is formed with a first through hole, the sliding block of the second adjusting column is formed with a second through hole, a first sidewall of the guiding rail of the first end portion is formed with a plurality of third through holes, a second sidewall of the guiding rail of the first end portion is formed with a plurality of third recesses, a first sidewall of the guiding rail of the second end portion is formed with a plurality of fourth through holes, a second side wall of the guiding rail of the second end portion is formed with a plurality of fourth recesses; the curved display device further comprises a third fixing column and a fourth fixing column; when the sliding block of the first adjusting column is positioned in the guiding rail of the first end portion and the sliding block of the second adjusting column is positioned in the guiding rail of the second end portion, the third fixing column sequentially penetrates through one of the plurality of third through holes, the first through hole and then is disposed in one of the plurality of third recesses, the fourth fixing column sequentially penetrates through one of the plurality of fourth through holes, the second through hole and then is disposed in one of the plurality of fourth recesses.

12. The curvature-adjustable curved display device as claimed in claim 11, wherein the plurality of third through holes are arranged with equal intervals, the plurality of fourth through holes are arranged with equal intervals, the plurality of third through holes and the plurality of fourth through holes are symmetrically disposed in one-to-one manner.

* * * * *